United States Patent
Sakuma

(10) Patent No.: US 8,648,422 B2
(45) Date of Patent: Feb. 11, 2014

(54) SEMICONDUCTOR DEVICE WITH HETERO JUNCTION

(75) Inventor: Takashi Sakuma, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 694 days.

(21) Appl. No.: 12/404,547

(22) Filed: Mar. 16, 2009

(65) Prior Publication Data
US 2009/0315116 A1 Dec. 24, 2009

(30) Foreign Application Priority Data

Jun. 19, 2008 (JP) ................................ 2008-160469

(51) Int. Cl.
*H01L 29/78* (2006.01)
*H01L 21/336* (2006.01)

(52) U.S. Cl.
USPC ........................................................ 257/368

(58) Field of Classification Search
USPC ........................................................ 257/368
See application file for complete search history.

(56) References Cited

U.S. PATENT DOCUMENTS

| | | | |
|---|---|---|---|
| 6,384,450 B1 * | 5/2002 | Hidaka et al. ................ | 257/321 |
| 6,579,784 B1 * | 6/2003 | Huang ........................... | 438/595 |
| 6,855,589 B2 | 2/2005 | Mori | |
| 7,473,623 B2 * | 1/2009 | Chen et al. .................... | 438/585 |
| 2001/0054725 A1 * | 12/2001 | Nagai et al. ................... | 257/288 |
| 2002/0076867 A1 * | 6/2002 | Lee et al. ....................... | 438/183 |
| 2005/0001267 A1 * | 1/2005 | Miyagawa et al. ............ | 257/332 |
| 2005/0048729 A1 * | 3/2005 | Yoon et al. .................... | 438/303 |
| 2005/0121719 A1 | 6/2005 | Mori | |
| 2006/0138398 A1 | 6/2006 | Shimamune et al. | |
| 2008/0003789 A1 * | 1/2008 | Chen et al. .................... | 438/585 |
| 2008/0169490 A1 | 7/2008 | Kawai | |
| 2008/0246092 A1 * | 10/2008 | Lee et al. ....................... | 257/377 |
| 2009/0242995 A1 | 10/2009 | Suzuki et al. | |

FOREIGN PATENT DOCUMENTS

| | | |
|---|---|---|
| EP | 1 677 260 A2 | 7/2006 |
| JP | 2004-095639 A | 3/2004 |
| JP | 2006-186240 A | 7/2006 |
| JP | 2006-344873 A | 12/2006 |
| JP | 2009-123997 A | 6/2009 |
| WO | 2007-034553 A1 | 3/2007 |

OTHER PUBLICATIONS

Japanese Office Action dated Nov. 13, 2012, issued in corresponding Japanese Patent Application No. 2008-160469, with Partial English translation (10 pages).

* cited by examiner

*Primary Examiner* — Matthew W Such
*Assistant Examiner* — Robert Carpenter
(74) *Attorney, Agent, or Firm* — Westerman, Hattori, Daniels & Adrian, LLP

(57) ABSTRACT

A semiconductor device includes: a semiconductor substrate made of first semiconductor having a first lattice constant; an isolation region formed in the semiconductor substrate and defining active regions; a gate electrode structure formed above each of the active regions; dummy gate electrode structures disposed above a substrate surface and covering borders between one of the active regions on both sides of the gate electrode structure and the isolation region; recesses formed by etching the active regions between the gate electrode structure and dummy gate electrode structures; and semiconductor layers epitaxially grown on the recesses and made of second semiconductor having a second lattice constant different from the first lattice constant.

14 Claims, 17 Drawing Sheets

SEMICONDUCTOR DEVICE WITH HETERO JUNCTION

CROSS-REFERENCE TO RELATED APPLICATION

This application is based upon and claims the benefit of priority of the Japanese Patent Application No. 2008-160469, filed on Jun. 19, 2008, the entire contents of which are incorporated herein by reference.

FIELD

The embodiments discussed herein are related to a semiconductor device having highly integrated MOS transistors and its manufacture method, and more particularly to a semiconductor device adopting strain technologies and its manufacture method.

BACKGROUND

An insulated gate type field effect transistor having a gate electrode with a gate insulating film being interposed is called a MIS transistor. If the gate insulating film is basically a silicon oxide film, this transistor is called a MOS transistor. A gate insulating film of a MIS transistor is not limited to a silicon oxide film, but may be a silicon oxynitride film or a laminated structure having a high dielectric film such as a HfSiO film laminated on a silicon oxynitride film. A gate electrode is not limited to a polysilicon film, and may also be an amorphous silicon film, a polycide film which laminates a silicide film on a polysilicon film, or a metal film.

Speeding up the operation of a MOS transistor has been realized conventionally by miniaturizing the MOS transistor in accordance with the scaling law. As a gate oxide film is thinned in conformity with the scaling law, leak current becomes large correspondingly. If leak current is to be suppressed, miniaturization of a MOS transistor does not necessarily result in high speed operation.

As technologies not dependent upon miniaturization for speeding up, so-called strain technologies (also called strained silicon and the like) have been paid attention. The strain technologies are an approach to improving a carrier mobility by applying compressive or tensile stress to a channel by some means. For example, it has been proposed to improve hole mobility by applying compressive stress to a channel region by embedding a silicon germanium (Si—Ge) layer having a lattice constant larger than that of Si in part of the source/drain regions of a p-channel type MOS field effect transistor (pMOSFET) formed by using a Si substrate (refer to JP-A-2006-186240).

If MOS field effect transistor is a n-channel type (nMOSFET), electron mobility can be improved by embedding a silicon carbon (Si—C) layer having a lattice constant smaller than that of Si in part of the source/drain regions.

SUMMARY

According to aspects of an embodiment, there is provided a semiconductor device including:
a semiconductor substrate made of first semiconductor having a first lattice constant;
an isolation region formed in said semiconductor substrate and defining an active region;
a gate electrode structure formed above said active region;
another gate electrode structure disposed above a surface of the semiconductor substrate and covering a portion of a border between the active region on both sides of the gate electrode structure and the isolation region;
a recess formed by etching the active region between the gate electrode structure and another gate electrode structure; and
a semiconductor layer epitaxially grown embedding the recess and made of second semiconductor having a second lattice constant different from the first lattice constant The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

In a structure that active regions are defined by shallow trench isolation (STI) in a silicon substrate, and a Si—Ge mixed crystal epitaxial layer is embedded or buried in an active region, leak current may be considered to increase if a hetero interface between Si and Si—Ge contacts the STI. Leak currents were measured by forming samples having a hetero interface contacting a STI isolation region, and samples having a hetero interface separated from a STI isolation region.

Figure 1A:
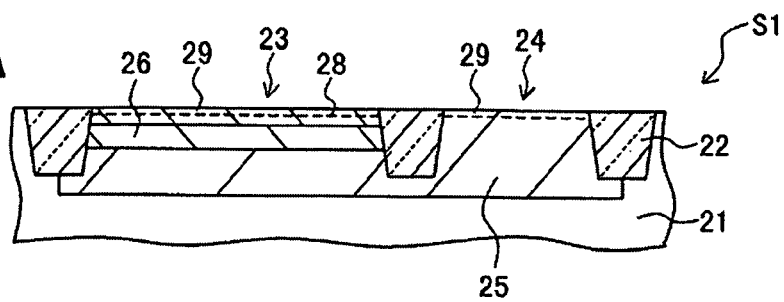
FIGS. 1A and 1B are a schematic cross sectional view and a schematic plan view illustrating the structure of a sample S1 having a hetero junction or interface reaching an isolation region.
Figure 1B:
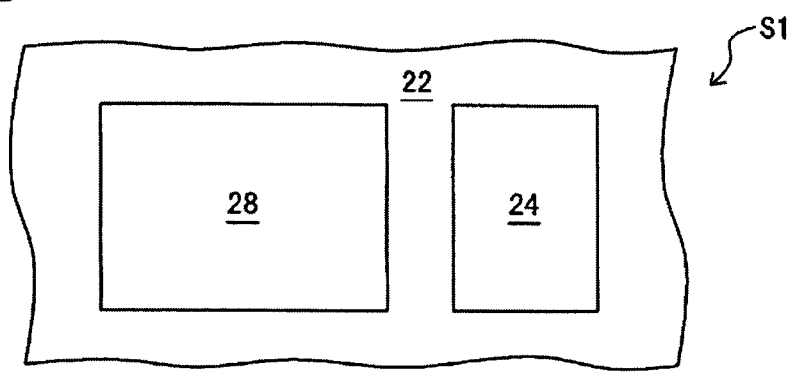

FIGS. 1A and 1B are a schematic cross sectional view and plan view illustrating the sample 51. An isolation region 22 made of a silicon oxide film is formed in a silicon substrate 21 by STI to define active regions 23 and 24. A n-type well 25 is formed by implanting n-type impurities deeper than the isolation region 22. The active regions 23 and 24 become an electrically continuous n-type region. By covering the active region 24 with a mask, p-type impurity ions are implanted into the active region 23 to form a p-type region 26. The p-type region 26 is etched to an intermediate depth to form a recess surrounded by the isolation region 22. Si—Ge mixed crystal is epitaxially grown in the recess to form a Si—Ge epitaxial layer 28. A nickel silicide layer 29 is formed on the surfaces of the active regions 24 and 28. The nickel silicide layer 29 is not, however, drawn in FIG. 1B. A diode is constituted of the p-type regions 28 and 26 and the n-type region 25. A hetero interface between the p-type Si—Ge region 28 and p-type Si region 26 is formed in approximately parallel to the active region surface, and terminates at the isolation region 22.

Figure 1C:
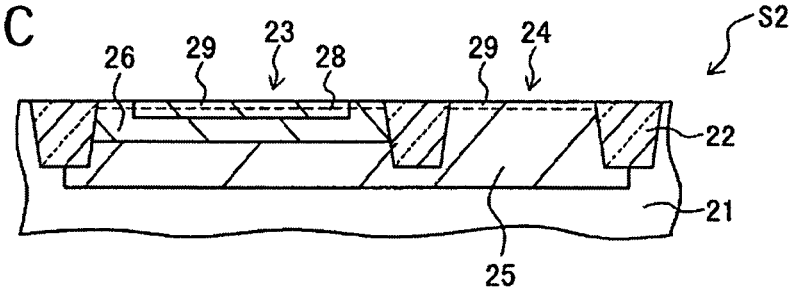
FIGS. 1C and 1D are a schematic cross sectional view and a schematic plan view illustrating the structure of a sample S2 having a hetero interface separated from an isolation region.
Figure 1D:
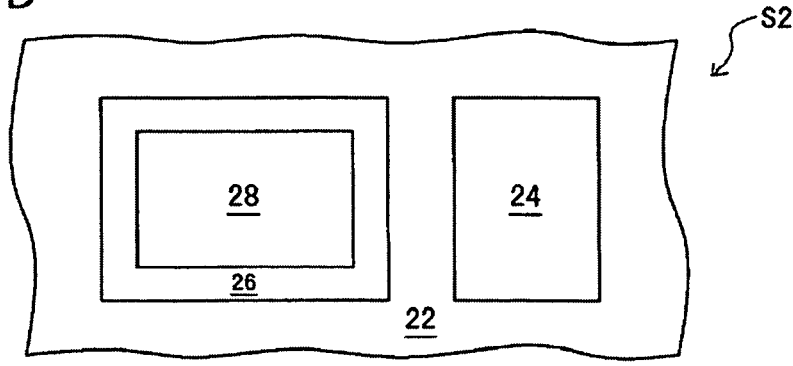

FIGS. 1C and 1D are a schematic cross sectional view and plan view illustrating the structure of a sample S2 having a hetero interface separated from an isolation region. Processes of forming an isolation region 22 of silicon oxide by STI (defining active regions 23 and 24), forming a n-type well 25 through n-type impurity ion implantation deeper than the isolation region 22, and ion implantation for a p-type region 26 are similar to those used for the sample S1 illustrated in FIGS. 1A and 1B. By using a mask which covers the active region 24 and the border area between the active region 28 and isolation region 22, a recess is formed in a central area of the p-type region 26, separated from the isolation region 22, and Si—Ge mixed crystal is epitaxially grown in the recess to form a Si—Ge epitaxial layer 28. A nickel silicide layer 29 is formed on the surfaces of the active regions 24, 26 and 28. The nickel suicide layer 29 is not, however, drawn in FIG. 1D. The hetero interface between the p-type Si—Ge region 28 and p-type Si region 26 terminates at the surface of the active region 23 and is separated from the isolation region 22. A separation distance was set to 20 nm.

Figure 1E:
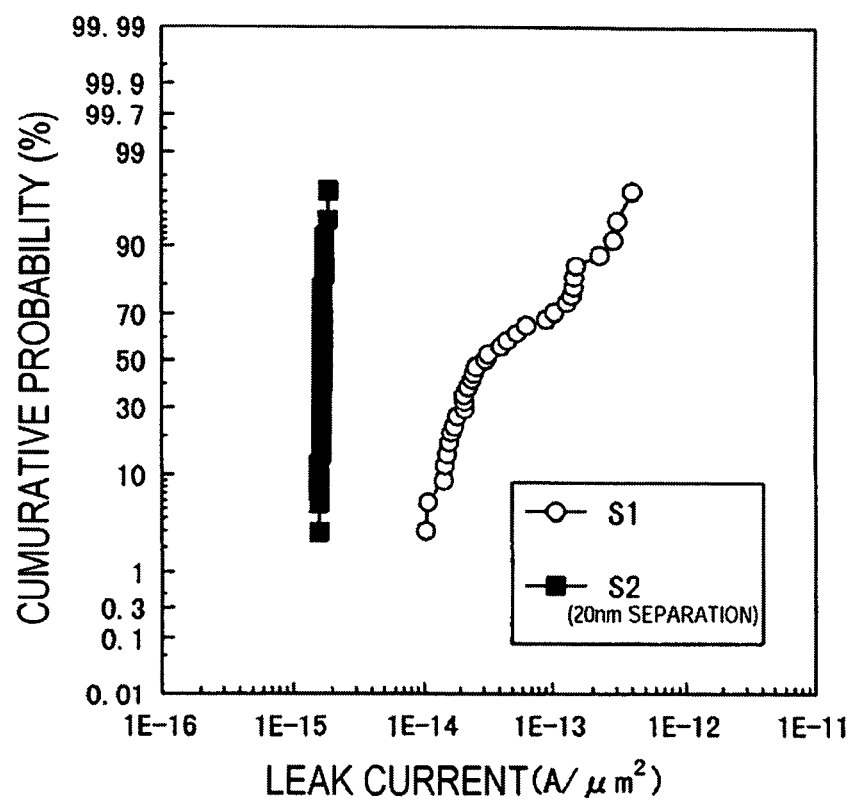
FIG. 1E is a graph illustrating the relation between leak current and cumulative probability in the samples S1 and S2.

FIG. 1E is a graph illustrating a relation between a leak current and a cumulative probability of the samples S1 and S2. The abscissa represents a leak current ($A/\mu m^2$), and the ordinate represents a cumulative probability (%). About 10% of the samples S1 have a leak current of about $1\times10^{-14}$ (described as 1E-14). However, about 50% of the samples S1 have a leak current not smaller than 2E-14 $A/\mu m^2$, and 10% or more of the samples S1 have a leak current not smaller than 1E-13 $A/\mu m^2$. A leak current of the samples 52 is approximately constant, smaller than 2E-15 $A/\mu m^2$. It can be understood that a leak current of the sample S2 is smaller by about one digit to two digits of the order of magnitude than the sample S1. It can be considered that as the hetero interface between the Si region and Si—Ge region terminates at the isolation region, the leak current increases, whereas when the hetero interfaces is separated from the isolation region, the leak current can be suppressed greatly. It can be expected that even if the hetero interface is separated partially from the isolation region, a leak current can be suppressed by an amount corresponding to the separated partial area. Embodiments will be described below, utilizing the above-described experimental results.

Figure 2A:
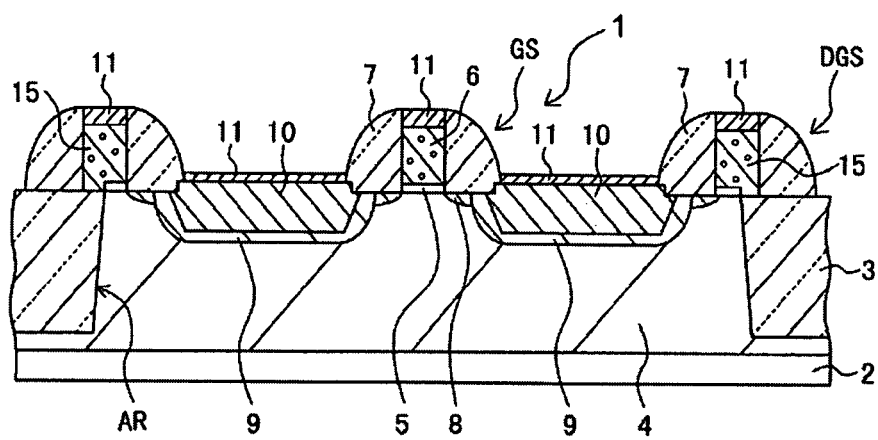
FIGS. 2A and 2B are a schematic cross sectional view and a schematic plan view illustrating a semiconductor device according to a first embodiment.
Figure 2B:
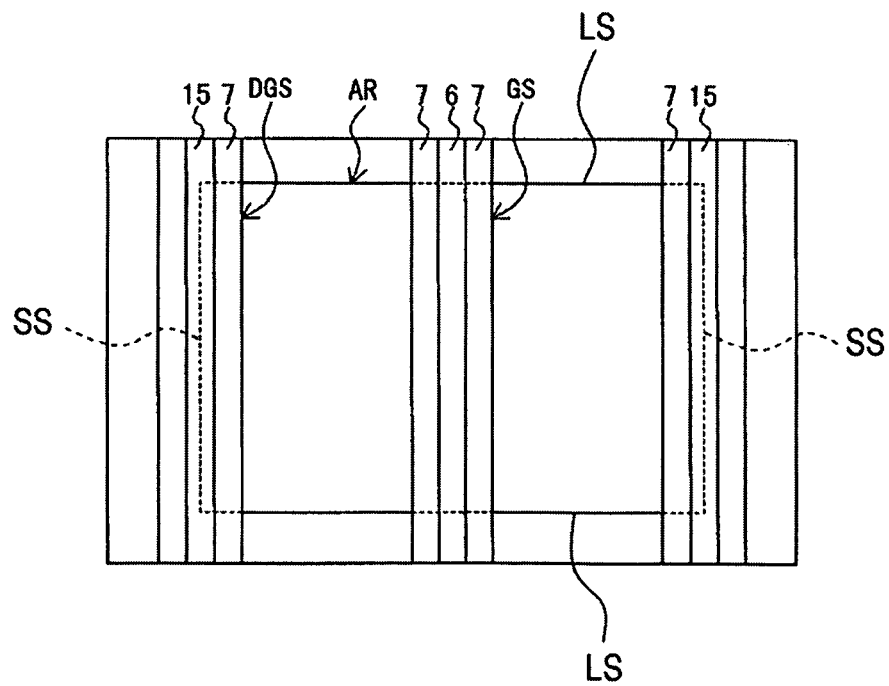

FIGS. 2A and 2B are a schematic cross sectional view and a schematic plan view of a semiconductor device of the first embodiment.

As illustrated in FIG. 2A, an isolation region 3 is formed in a single crystal semiconductor substrate 2 such as a Si substrate by well-known shallow trench isolation (STI) to define active regions AR. A well 4 is formed by introducing impurities of a first conductivity type. A gate electrode 6 of polysilicon or the like is formed above the surface of the active region AR, with a gate insulating film 5 of silicon oxide or the like being interposed therebetween. Dummy gate electrodes 15 are formed on the border areas between the isolation region and active region, at the same time when the gate electrode 6 is formed. By using the gate electrode 6 and dummy gate electrodes 15 as a mask, dopant impurities of a second conductivity type opposite to the first conductivity type is introduced into the active region AR shallowly to form source/drain extension (SDE) regions 8.

Side wall spacers 7 of an insulating film of silicon oxide or the like are formed on the side walls of the gate electrode 6 and dummy gate electrodes 15 to form a gate electrode structure GS and dummy gate electrode structures DGS together with the gate electrode 6 and dummy gate electrodes 15 respectively.

FIG. 2B is a plan view of the semiconductor substrate formed with the gate electrode structure GS and dummy gate electrode structures DGS. The active region AR has a rectangular shape defined by first opposing sides LS and second opposing sides SS. The gate electrode 6 traverses the active region AR in a vertical direction, and crosses the first opposing sides LS. The dummy gate electrodes 15 are disposed in parallel to a longitudinal direction of the gate electrode 6, and cover the second opposing sides SS. The gate electrode 6 and dummy gate electrodes 15 can be formed by using a line and space pattern. The side wall spacers 7 are formed on side walls of both sides of each of the gate electrode 6 and dummy gate electrodes 15, and cover the substrate surface by a predetermined width.

In regions between the gate electrode structure GS and dummy gate electrode structures DGS, source/drain (SD) regions 9 are formed by introducing dopant impurities of the second conductivity type into the region deeper than the source/drain extensions 8. In the active regions between the gate electrode structure GS and dummy gate electrode structures DGS, recesses invading or creeping under the side wall spacers 7 are formed and filled with semiconductor epitaxial layers 10 having a lattice constant different from that of the semiconductor substrate 2. Silicide layers 11 of nickel silicide (NiSi), cobalt silicide ($COSi_2$) or the like are formed on the surfaces of the gate electrode 6, SD regions 9 and semiconductor layers 10, MOSFET 1 is formed in this manner. Since the semiconductor layers 10 having a lattice constant different from that of the semiconductor substrate 2 are embedded or buried in the regions functioning as source/drain regions SD, stress is generated in the channel region just under the gate electrode 6 so as to improve the mobility of carriers moving in the channel region.

For example, when a Si substrate is used as the semiconductor substrate 2 and the second conductivity type is the p-type and MOSFET 1 is a p-channel MOS transistor, the semiconductor layers 10 may be Si—Ge layers or Si—Ge—C layers having a larger lattice constant than Si, generating compressive stress in the channel region. When MOSFET 1 is a n-channel MOS transistor, the semiconductor layers 10 may be Si—C layers having a smaller lattice constant than Si, generating tensile stress in the channel region.

The Si—Ge layer, Si—Ge—C layer and Si—C layer may contain some additional element.

Since the semiconductor layers 10 are formed, while being spaced from the border between the isolation region and active region (second opposing side SS), by the dummy gate electrode structure DGS on the border area between the isolation region and active region, a junction leak current can be suppressed.

Figure 3A:
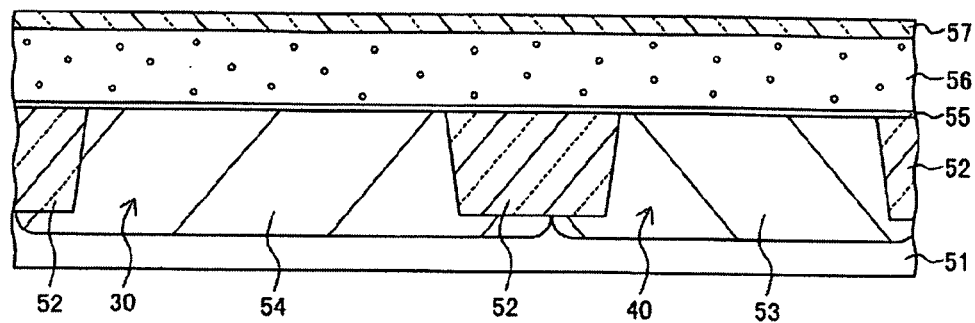
FIGS. 3A to 3O are cross sectional views of a semiconductor substrate illustrating main processes of a method of manufacturing a semiconductor device including MOS transistors illustrated in FIGS. 2A and 2B by forming SDE regions and SD regions after semiconductor epitaxial layers are embedded (or buried).
Figure 3B:
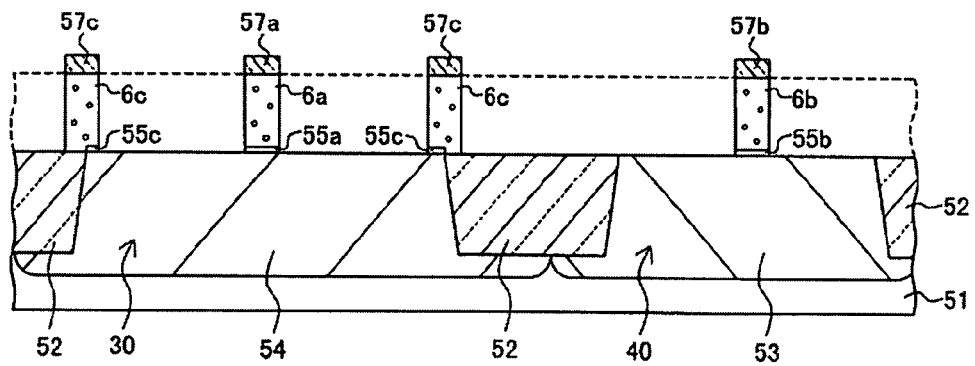
Figure 3C:
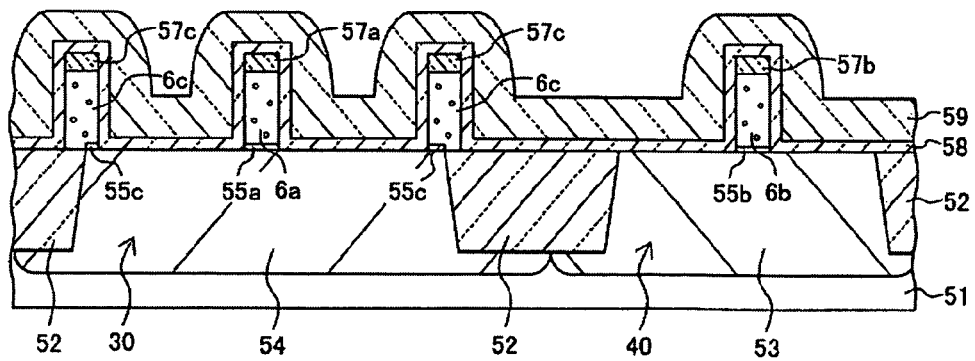
Figure 3D:
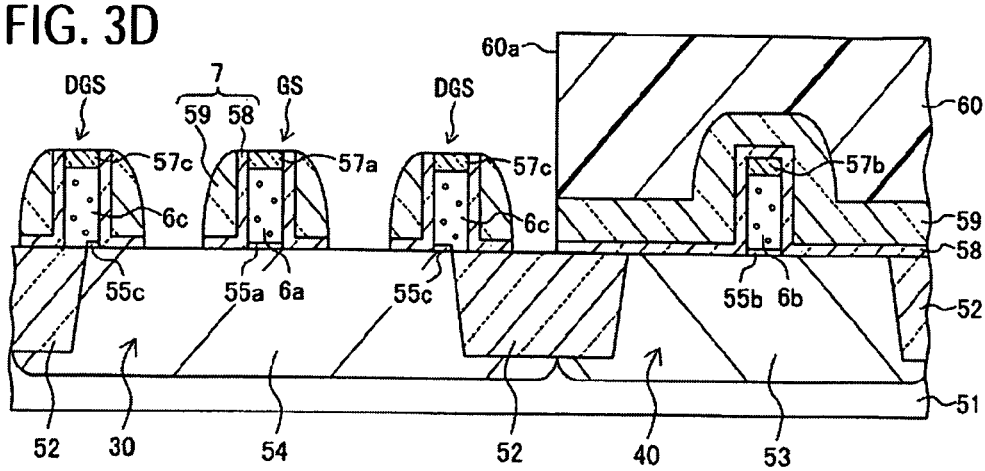
Figure 3E:
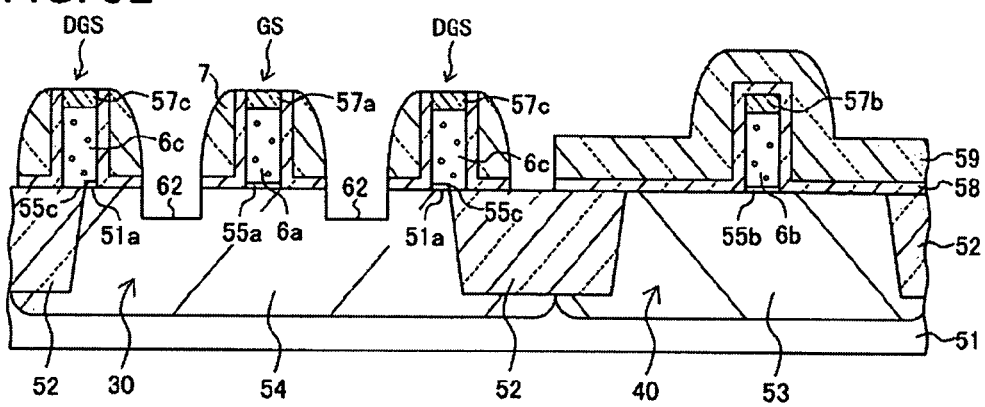
Figure 3F:
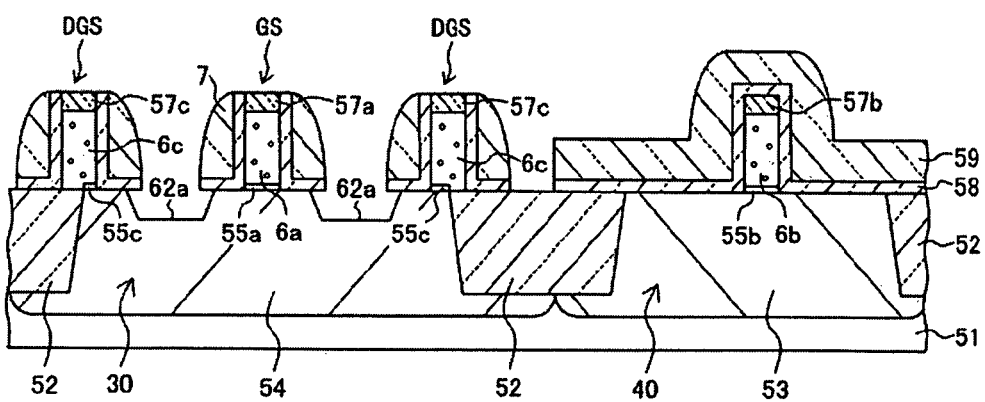
Figure 3G:
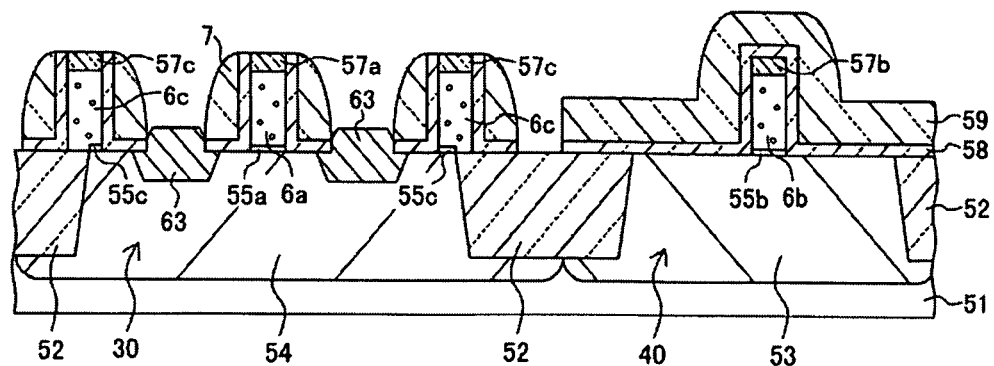
Figure 3H:
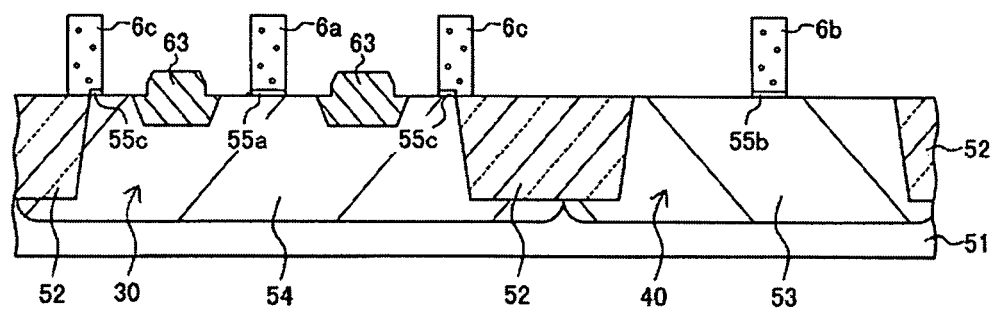
Figure 3I:
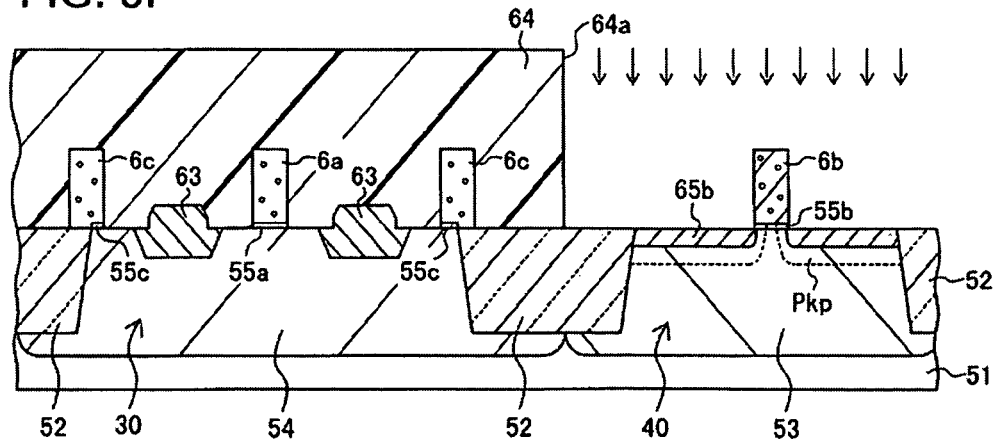
Figure 3J:
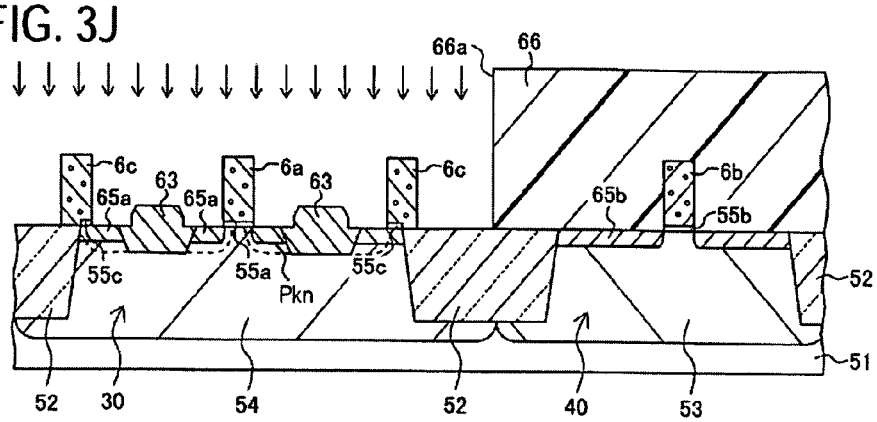
Figure 3K:
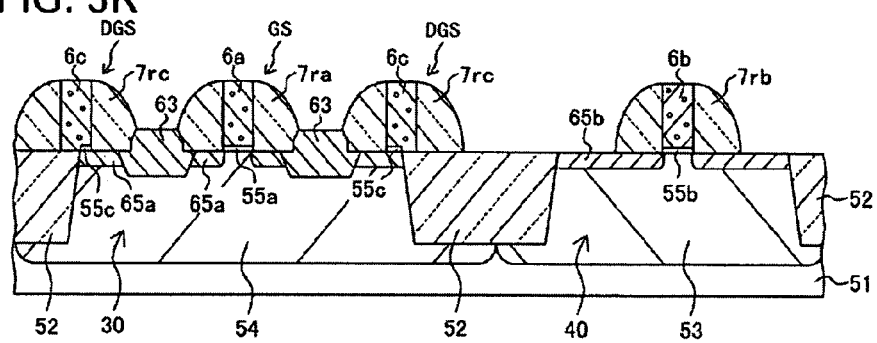
Figure 3L:
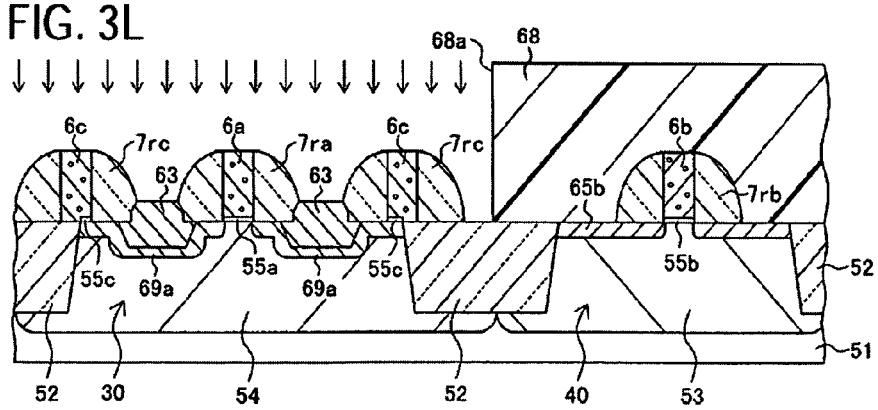
Figure 3M:
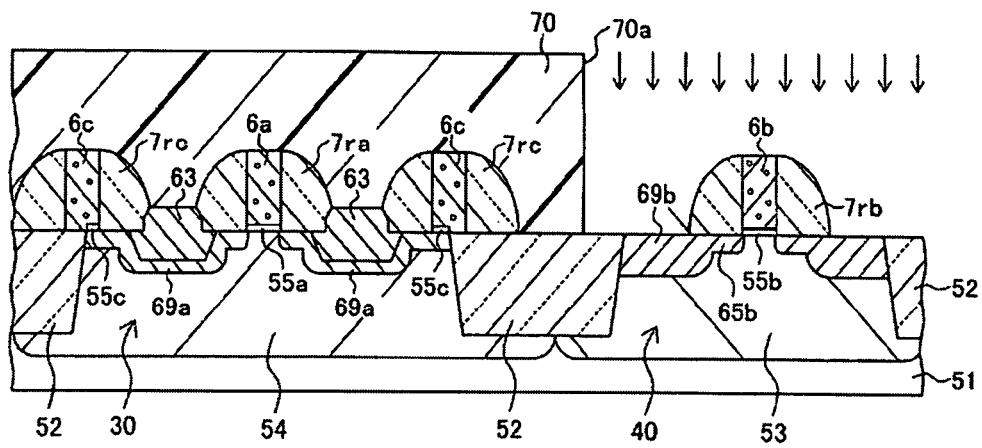
Figure 3N:
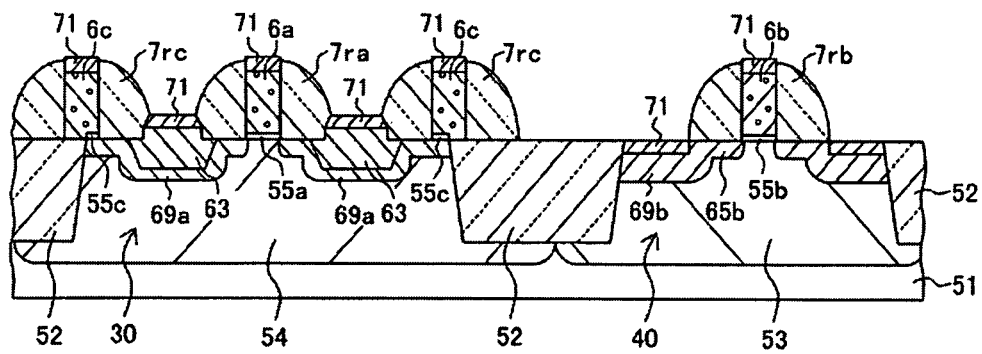
Figure 3O:
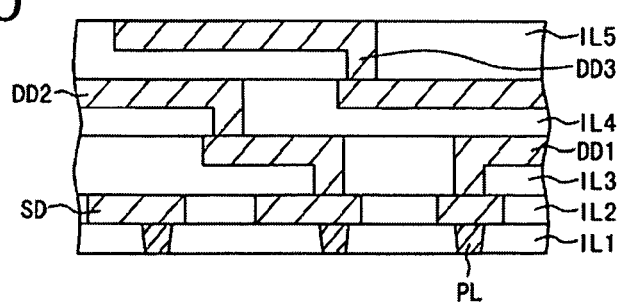

With reference to FIGS. 3A to 3O, description will be made on a method for manufacturing a semiconductor device having a MOS transistor illustrated in FIGS. 2A and 2B.

As illustrated in FIG. 3A, an isolation region 52 is formed in a Si substrate 51 to define an active region for forming pMOSFET (called a "pMOS forming region") 30 and an active region for forming nMOSFET (called a "nMOS forming region") 40. The isolation region 52 is formed by well-known STI.

A photoresist film is formed on the whole substrate surface, for example, by spin coating, and a photoresist pattern having an opening exposing the nMOS forming region 40 is formed by photolithography. By using the photoresist pattern as a mask, p-type impurity ions such as boron are implanted into the nMOS forming region 40 to form a p-type well 53 in the nMOS forming region 40. The photoresist pattern is thereafter removed. A photoresist pattern having an opening exposing the pMOS forming region 30 is newly formed, and n-type impurities such as phosphorus are implanted into the pMOS forming region 30 to form a n-type well 54 in the pMOS forming region 30. The photoresist pattern is thereafter removed. For example, the surfaces of the active regions 30 and 40 are thermally oxidized to grow a silicon oxide film having a thickness of 1.2 nm and form a gate insulating film 55. The gate insulating film 55 may be a silicon oxide film subjected to plasma nitridation, i.e., a silicon oxynitride film, or films laminating a film containing hafnium (Hf), which has a higher dielectric constant than silicon oxide or silicon nitride, on a silicon oxide film or on a silicon oxynitride film, as well as the silicon oxide film.

A polysilicon film 56 having a thickness of 100 nm is deposited on the whole substrate surface, and a silicon nitride film 57 to be used as an etching mask is formed thereon. The silicon nitride film 57 is patterned into gate electrode pattern including dummy gate electrode patterns, by photolithography.

As illustrated in FIG. 3B, by using patterned silicon nitride films 57a, 57b and 57c as a mask, the polysilicon film 56 and gate insulating film 55 are subjected to, for example, anisotropic etching. A structure is therefore obtained in which gate electrodes 6a, 6b and 6c are formed in the pMOS forming region 30 and nMOS forming region 40 with gate insulating films 55a, 55b and 55c being interposed. The gate electrodes 6c are formed above the border areas between the isolation region and active region, and become the dummy gate electrodes 15 illustrated in FIG. 2B. It is desired that the silicon nitride films 57a, 57b and 57c are not removed and left because the silicon nitride films protect the gate electrodes 6a, 6b and 6c during processes to be executed later.

Instead of polysilicon, the gate electrode material may be amorphous silicon, metal, metal nitride such as titanium nitride (TiN), metal carbide such as tantalum carbide (TaC) or one of alloys thereof.

As illustrated in FIG. 3C, a silicon oxide film 58 and a silicon nitride film 59 are formed on the whole substrate surface by thermal chemical vapor deposition (CVD). For example, the silicon oxide film 58 having a thickness of 5 nm to 30 nm is deposited at a film forming temperature of 550° C. to 700° C. by using tetraethoxysilane (TEOS) as Si source gas. The silicon nitride film 59 having a thickness of 10 nm to 60 nm may be deposited on the silicon oxide film 58 at a film forming temperature of 600° C. to 800° C. by using dichlorosilane ($SiH_2Cl_2$) and ammonium ($NH_3$) as Si and N source gases.

As illustrated in FIG. 3D, a photoresist film is formed on the whole substrate surface, for example, by spin coating, and a photoresist pattern 60 having an opening 60a exposing the pMOS forming region 30 is formed by photolithography. This opening 60a corresponds to an epitaxial growth region for Si—Ge layers to be described later. By using the photoresist pattern 60 as a mask, the silicon nitride film 59 and silicon oxide film 58 in the pMOS forming region 30 are anisotropically etched, for example, by using hydrofluorocarbon as etching gas, to form side wall spacers (called "first side wall spacers") 7 constituted of a lamination structure of the silicon oxide film 58 and silicon nitride film 59 on side walls of the gate electrode 6a and dummy gate electrodes 6c (15) in the pMOS forming region 30. The gate electrode structure GS and dummy gate electrode structures DGS illustrated in FIG. 2B are therefore formed.

As illustrated in FIG. 3E, by using the gate electrode structure GS and dummy gate electrode structures DGS as a mask, the Si substrate 51 in the pMOS forming region 30 is selectively etched (called "first etching") to form recesses 62. For example, the first etching is performed by reactive ion etching (RIE) using hydrogen bromide (HBr). A depth of the recess 62 is set to, e.g. about 50 nm. After the first etching, the photoresist pattern 60 is removed. Next, a wet process using hydrofluoric acid (HF) is performed to dean the surface of the recesses 62.

As illustrated in FIG. 3F, by using the silicon oxide film 58 and silicon nitride film 59 as a mask, chemical dry etching (called "second etching") is performed for the recesses 62 to remove the damaged surface layer and form recesses 62a invading or creeping under the side wall spacers 7. For example, this second etching is performed at 600° C. to 900° C. by using hydrogen chloride (HCl) gas, chlorine ($Cl_2$) gas or the like. An etching depth is set to, for example about 20 nm. By performing the second etching, it becomes possible to control the recess shape, expose a good crystalline surface, and perform good epitaxial growth thereon. In the illustrated cross section, outermost side edges of the recesses 62a are separated from the isolation region 52 by a predetermined distance, because of existence of the dummy gate electrode structures DGS.

The recess 62a may be formed by wet etching. Chemical dry etching is advantageous in that selective epitaxial growth to be described later can be continuously performed after forming the recesses 62a, and that surface state of the recesses after etching can be controlled easily.

As illustrated in FIG. 3G, Si—Ge layers 63 are selectively and epitaxially grown on the recesses 62a, for example, by low pressure thermal CVD. The growth conditions are, for example, that mixture gas of dichlorosilane $SiH_2C12$, germane $GeH_4$, hydrogen chlorine HCl and hydrogen $H_2$ is used as source gases, film forming temperature is set to 500° C. to 800° C., and chamber pressure is set to 100 Pa to 5000 Pa. Gas flow rates are set to 50 sccm to 300 sccm for $SiH_2Cl_2$, 50 sccm to 300 sccm for $GeH_4$, and 30 sccm to 300 sccm for Ha.

Si—Ge—C layers may be formed instead of the Si—Ge layers 63. In this case, methylsilane $SiH_3CH_3$ at a flow rate of 2 sccm to 50 sccm is added to the above-described mixture gas to be used as the source gas. In forming the Si—Ge layers 63 or Si—Ge—C layers, the source gas may be silane $SiH_4$, disilane $Si_2H_6$, trisilane $Si_3H_8$, or hexachlorotrisilane $Si_3Cl_6H_2$ as a substitute for $Si_2H_6$, dichrorogermane $GeH_2Cl_2$ as a substitute for $GeH_4$, or $Cl_2$ as a substitute for HCl.

As described previously, since the dummy gate electrode structure DGS is disposed covering partially the border between the active region and isolation region 52, the SiGe layer 63 is formed, while being separated from the isolation region 52. A distance from the isolation region 52 to the Si—Ge layer 63 is determined from the position where the dummy gate electrode 6c (15) is disposed and a width of the side wall spacer 7. This distance is set, for example, at 5 nm to 100 nm, and more preferably at 10 nm to 50 nm. If the distance is shorter than 5 nm, the Si—Ge layer 63 may not be separated from a desired portion of the isolation region 52 by a predetermined distance, when positional disalignment occurs in photolithography in patterning the gate electrodes illustrated in FIG. 3B. If the distance is longer than 100 nm, volume of the Si—Ge layer 63 occupied in the pMOS forming region 30 becomes small so that it may become difficult to apply sufficient stress to the channel region.

As illustrated in FIG. 3H, the first side wall spacers 7 constituted of the silicon nitride film 59 and silicon oxide film 58 formed on the side walls of the gate electrodes 6a and 6c, as well as those covering the gate electrode 6b, are removed. The silicon nitride film 59 is removed by using phosphoric acid ($H_3PO_4$) or the like, and the silicon oxide film 58 is removed by using HF or the like.

As illustrated in FIG. 3I, a photoresist film is formed on the whole substrate surface, for example, by spin coating, and a photoresist pattern 64 having an opening 64a exposing the nMOS forming region 40 is formed by photolithography. By using the photoresist pattern 64 as a mask, p-type impurities such as indium (In) are introduced into relatively deep regions of the p-type well 53 on both sides of the gate electrode 6b, for example, by ion implantation, for example, at an acceleration energy of 50 keV and a total dose of $5 \times 10^{13}$ $cm^2$, to form p-type pocket regions Pkp. Since the pocket region Pkp has the same conductivity type as that of the well 53, the pocket region is not drawn in the following drawings. By using the photoresist pattern 64 as a mask, n-type impurities such as arsenic (As) are introduced into shallow regions of the Si substrate 51 on both sides of the gate electrode 6b, for example, by ion implantation, at an acceleration energy of 5 keV and a dose of $1 \times 10^{15}$ $cm^2$, to form source/drain extension (SDE) regions 65b. The photoresist pattern 64 is thereafter removed.

As shown in FIG. 3J, a photoresist film is formed on the whole substrate surface, for example, by spin coating, and a photoresist pattern 66 having an opening 66a exposing the pMOS forming region 30 is formed by photolithography. By using the photoresist pattern 66 as a mask, n-type impurities such as As are introduced into relatively deep regions of the n-type well 54 between the gate electrode 6a and dummy gate electrodes 6c, for example, by ion implantation, at an acceleration energy of 40 keV and a dose of $2 \times 10^{13}$ $cm^2$, to form n-type pocket regions Pkn. Since the pocket region Pkn has the same conductivity type as that of the well 54, the pocket region is not drawn in the following drawings. By using the photoresist pattern 66 as a mask, p-type impurities such as boron (B) are introduced into shallow regions of the n-type well 54 between the gate electrode 6a and dummy gate electrodes 6c, for example, by ion implantation, at an acceleration energy of 0.5 keV and a dose of $2 \times 10^{14}$ $cm^2$, to form source/drain extension (SDE) regions 65a. The photoresist pattern 66 is thereafter removed.

As illustrated in FIG. 3K, a silicon oxide film having a thickness of 50 nm to 100 nm is formed on the whole substrate surface by thermal CVD, and thereafter anisotropic etching is performed to form side wall spacers (called "second side wall spacers") 7ra, 7rb and 7rc of silicon oxide on side walls of the gate electrodes 6a, 6b and 6c. For example, bistertialbutylaminosilane (BTBAS) and oxygen ($O_2$) are used as source gases for forming the silicon oxide film, and film forming temperature is set at 500° C. to 580° C. After the first side wall spacers 7 are removed, the second side wall spacers 7r are formed on the side walls of the same gate electrodes 6a, 6b and 6c. Therefore, even when there may exist a difference between film thicknesses, center position between opposing side wall spacers will not change. The recesses 62a and semiconductor epitaxial layers 63 are disposed between the newly formed gate electrode structure GS and dummy gate electrode structures DGS with a central position unchanged.

As illustrated in FIG. 3L, a photoresist film is formed on the whole substrate surface, for example, by spin coating, and a photoresist pattern 68 having an opening 68a exposing the pMOS forming region 30 is formed by photolithography. By using the photoresist pattern 68 as a mask, p-type impurities such as B are introduced into the n-type well 54, for example, by ion implantation at an acceleration energy of 8 keV and a dose of $5 \times 10^{15}$ $cm^2$, to form source/drain (SD) regions 69a deeper than the SDE regions 65a. After the SD regions 69a are formed, the photoresist pattern 68 is removed.

As illustrated in FIG. 3M, a photoresist film is formed on the whole substrate surface, for example, by spin coating, and a photoresist pattern 70 having an opening 70a exposing the nMOS forming region 40 is formed by photolithography. By using the photoresist pattern 70 as a mask, n-type impurities such as phosphorus (P) are introduced into the p-type well 53, for example by ion implantation at an acceleration energy of 6 keV and a dose of $8 \times 10^{15}$ $cm^2$, to form SD regions 69b deeper than the SDE regions 65b. After the SD regions 69b are formed, the photoresist pattern 70 is removed.

After the SD regions 69a and 69b are formed, heat treatment is performed to activate introduced impurities, for example, by rapid thermal annealing (RTA). Heat treatment is performed in a short time at a temperature of, e.g., 1000° C.

As illustrated in FIG. 3N, silicide is formed by a well-known self aligned silicide (SALICIDE) method. For example, a nickel (Ni) film having a thickness of about 5 nm to 20 nm is deposited on the whole substrate surface, for example, by sputtering. Heat treatment is performed to react Ni and Si (of the Si substrate 51 and the exposed polysilicon of the gate electrodes). This heat treatment is performed, for example, at 100° C. to 500 DC in an inert gas atmosphere of $N_2$, Ar or the like. Excessive Ni not used for reaction with Si is removed, for example, by a mixture chemical of hydrochloric acid and hydrogen peroxide solution. If necessary, the second heat treatment is performed, for example, at 200° C. to 500° C. in an inert gas atmosphere of $N_2$, Ar or the like. In this manner, a nickel silicide (NiSi) film 71 having a thickness of about 10 nm to 40 nm is formed in each surface layer of the gate electrodes 6a, 6b and 6c, SD regions 69a and 69b and Si—Ge layers 63.

As illustrated in FIG. 3O, a lower interlayer insulating film IL1 is deposited on the whole substrate surface, and conductive plugs PL are buried to be connected with the MOS transistors. An interlayer insulating film IL2 is deposited on the lower interlayer insulating film IL1, wiring trenches are etched, and single damascene copper wirings SD are buried. Thereafter, processes of depositing interlayer insulating films IL3, IL4 and IL5, forming dual damascene wiring trenches and burying dual damascene copper wirings DD1, DD2 and DD3 are repeated a desired number of times to form metal multilayer wirings to manufacture a ULSI semiconductor device.

As illustrated in FIG. 2B, the above-described embodiment forms the gate electrode traversing the rectangular active region defined by the first and second opposing sides LS and SS and crossing the first opposing sides, the dummy gate electrodes covering the second opposing sides, and the semiconductor epitaxial layer separated from the isolation region disposed along the second opposing sides SS by using the dummy gate electrode structures. The layout of the dummy gate electrodes is not limited thereto.

Figure 4A:
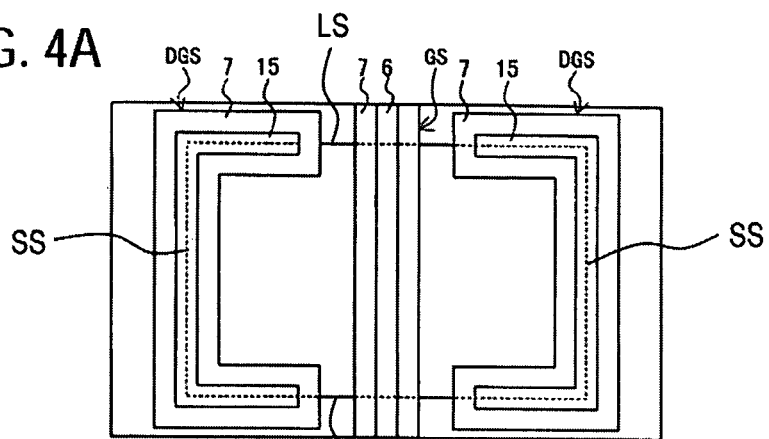
FIGS. 4A, 4B and 4C are plan views illustrating other layouts of a dummy gate electrode structure.
Figure 4B:
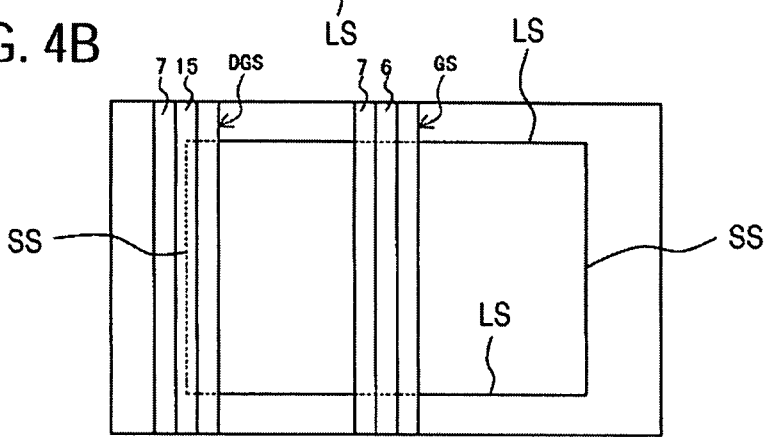
Figure 4C:
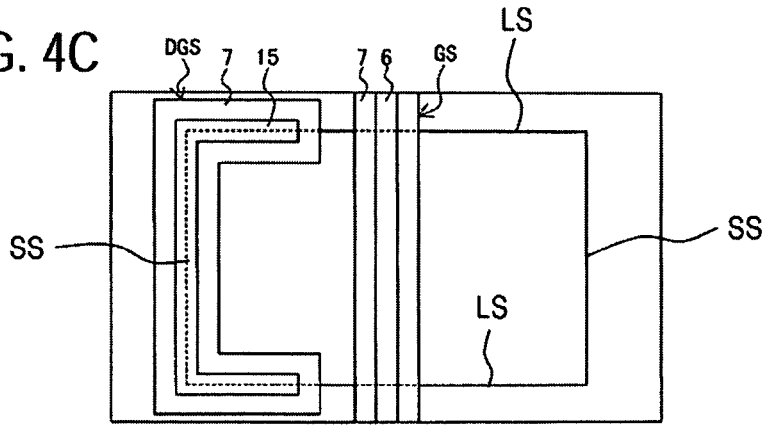

FIGS. 4A, 4B and 4C are plan views illustrating other layouts of dummy gate electrode structures.

As illustrated in FIG. 4A, dummy gate electrodes 15 are formed covering the second opposing sides SS of the rectangular active region and partially covering the first opposing sides LS. Since the dummy gate electrode structures are formed covering most of the border between the isolation region and active region, leak current suppression effect will become large. There may be some restrictions on layout of dummy gate electrode structure in view of the circuit design. In such a case, the dummy gate electrode may be disposed in allowable area or areas.

As illustrated in FIG. 4B, one dummy gate electrode structure DGS of the layout illustrated in FIG. 2B may be omitted.

As illustrated in FIG. 4C, one dummy gate electrode structure DGS of the layout illustrated in FIG. 4A may be omitted.

Which structure illustrated in FIG. 2B and FIGS. 4A to 4C is to be selected may be determined from the size, layout, required characteristics and the like of the MOSFET's. In these layouts described above, a dummy gate electrode is disposed also above the active region. If a channel is induced under the dummy gate electrode, unexpected adverse effect may arise. The dummy gate electrode is preferably a pure dummy not having a circuit function.

A structure for separating the semiconductor epitaxial layer from the border between the active region and isolation region is not limited to the above-described structure. It is possible to separate the semiconductor epitaxial layer from the border by partially covering the border only with side wall spacers on side walls of another gate electrode formed on the isolation region.

Figure 5A:
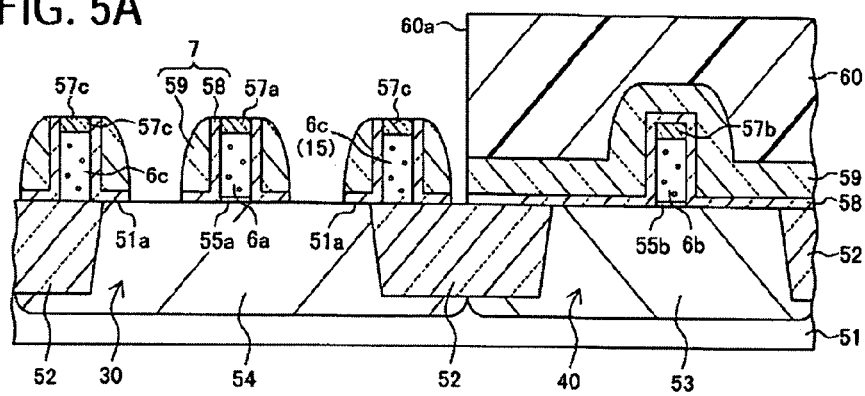
FIGS. 5A, 5B and 5C are schematic cross sectional views and a schematic plan view illustrating a semiconductor device according to a second embodiment, with side wall spacers partially covering a border between an active region and an isolation region.
Figure 5B:
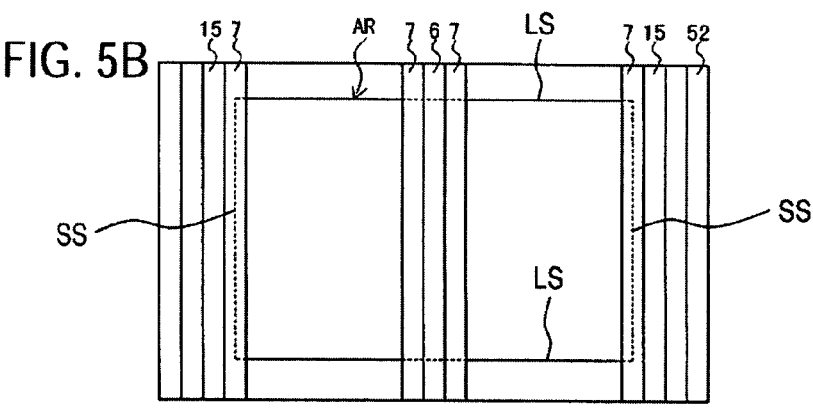
Figure 5C:
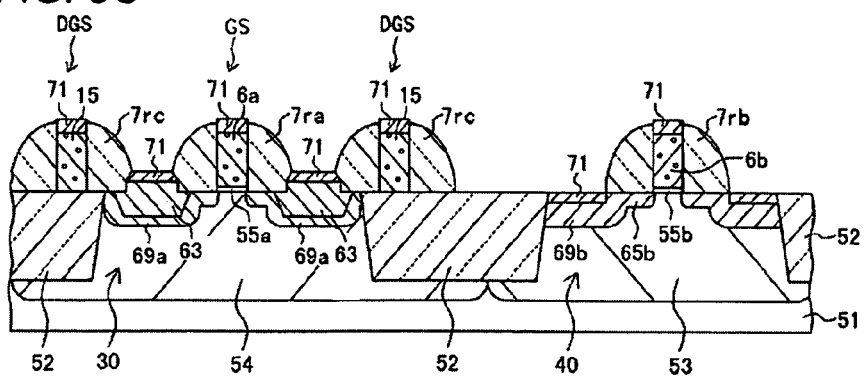

FIGS. 5A to 5C are cross sectional views and a plan view illustrating the second embodiment in which the side wall spacer on the side wall of another gate electrode partially covers the border between the active region and isolation region. Another gate electrode is formed on the isolation region, and disposed in such a manner that the side wall spacer of an insulating film formed on the side wall of another gate electrode is positioned on the border (second opposing side SS) between the isolation region and active region. Although description will be made by calling another gate electrode a dummy gate electrode, another gate is not necessarily required to be a dummy. It may be a gate electrode for another MOSFET. Structures other than another gate electrode are similar to those illustrated in FIGS. 2A and 2B. Manufacture processes of the second embodiment may be the same as those of the first embodiment.

As illustrated in FIG. 5A, an isolation region 52 is formed in a silicon substrate 51, and a n-type well 54 and a p-type well 53 are formed. A gate insulating film 55 is formed on the surface of the active region, and a polysilicon gate electrode layer 6 and an insulating mask layer 57 are formed on and above the gate insulating film. The gate electrodes 6a, 6b and 6c are patterned. The gate electrodes 6c are formed on the isolation region 52, and function as dummy gate electrode 15b of the first embodiment. A silicon oxide film 58 and a silicon nitride film 59 are deposited, and a photoresist pattern 60 covering the p-type well 53 is formed. By using the photoresist pattern 60 as a mask, anisotropic etching is performed to form side wall spacers 7 on side walls of the gate electrodes 6a and 6c. The side wall spacers 7 formed on the side walls of the dummy gate electrodes 6c extend from the isolation region 52 onto the n-type well 54, and covers the n-type well 54 by a predetermined distance from a border SS between the isolation region 52 and n-type well 54.

FIG. 5B is a plan view of the substrate formed with the side wall spacers 7. The active region AR has a rectangular shape defined by the first opposing sides LS and second opposing sides SS. The gate electrode 6 traverses the active region AR in the vertical direction, and crosses the first opposing sides SS. The dummy gate electrodes 15 are formed on the isolation region 52. The side wall spacers 7 on the inner side walls of the dummy gate electrodes 15 are formed covering the second opposing side SS, and cover the border parallel to the longitudinal direction of the gate electrode in the border between the isolation region and active region. The state illustrated in FIGS. 5A and 5B corresponds to the state illustrated in FIG. 3D.

By using processes similar to those illustrated in FIGS. 3E to 3G, recesses are etched in the n-type well 54, and Si—Ge epitaxial layers are grown, embedding or burying the recesses. By using processes similar to those illustrated in FIGS. 3H to 3J, after the side wall spacers 7 are removed, extension regions are formed by ion implantation. By using processes similar to those illustrated in FIGS. 3K to 3N, side wall spacers area formed, SD regions are formed by ion implantation, and SALICIDE process is performed.

As illustrated in FIG. 5C, the recesses are formed in the regions between the gate electrode structure GS and dummy gate electrode structures DGS, and are embedded or buried with the grown semiconductor epitaxial layers 63. The SDE regions and SD regions are formed surrounding the semiconductor epitaxial layers. The layout that another gate electrode is disposed on the isolation region, and the side wall spacer disposed on the side wall of another gate electrode covers the border area between the isolation region and active region, is not limited to that illustrated in FIG. 5B.

Figure 6A:
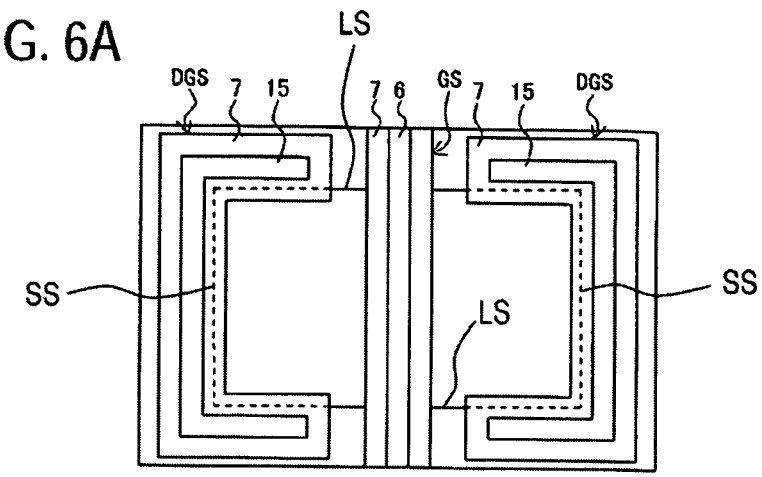
FIGS. 6A, 6B and 6C are plan views illustrating other layouts in which another gate electrode is disposed on the isolation region, and side wall spacers on side walls of another gate electrode partially cover the border between the active region and isolation region.
Figure 6B:
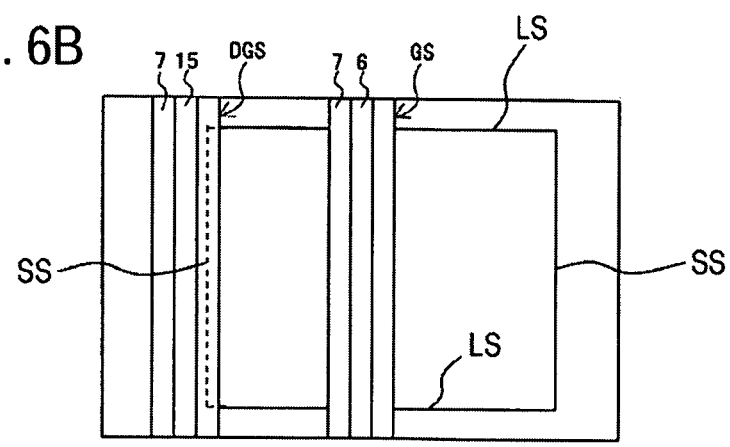
Figure 6C:
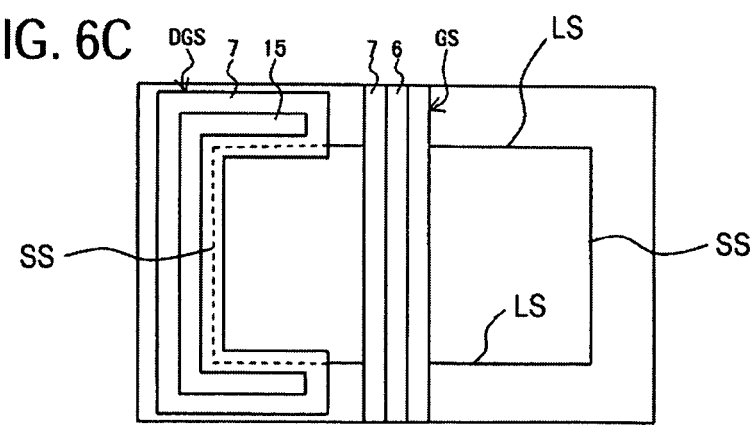

FIGS. 6A to 6C are plan views illustrating other layouts in which another gate electrode is disposed on an isolation region, and a side wall spacer on the side wall of another gate electrode partially covers the border area between the active region and isolation region.

As illustrated in FIG. 6A, an active region AR has a rectangular shape defined by first opposing sides LS and second opposing sides SS, A gate electrode structure GS traverses the active region AR in a vertical direction, and crosses the first opposing sides IS. Other gate electrodes 15 are disposed outside the second opposing sides SS of the rectangular active region and portions of the first opposing sides LS. Dummy gate electrode structures DGS having a side wall spacer on the side wall of the dummy gate electrode cover the second opposing sides SS and portions of the first opposing sides LS. Since the dummy gate electrode structures can be formed covering most of the border between the isolation region and active region, leak current suppression effects are expected to become large. There may be some restrictions on the layout of the dummy gate electrode structure in terms of circuit design. In such a case, the dummy gate electrode may be disposed in an allowable area or areas.

As illustrated in FIG. 6B, one dummy gate electrode structure DGS of the layout illustrated in FIG. 5B may be omitted.

As illustrated in FIG. 6C, one dummy gate electrode structure DGS of the layout illustrated in FIG. 6A may be omitted.

The structure that the semiconductor epitaxial layer is grown, while being separated from the isolation region is not limited to those structures described above by way of example. If the semiconductor epitaxial layer in the active region is grown, while being separated from at least a portion of the isolation region (including a case in which separated portions are distributed), some amount of leak current suppressing effect will be obtained. Another gate electrode called herein a dummy gate electrode and formed on the isolation region will not induce a parasitic channel even if a voltage is applied. Therefore, a gate electrode of another MOS transistor may be used as another gate electrode.

Figure 7:
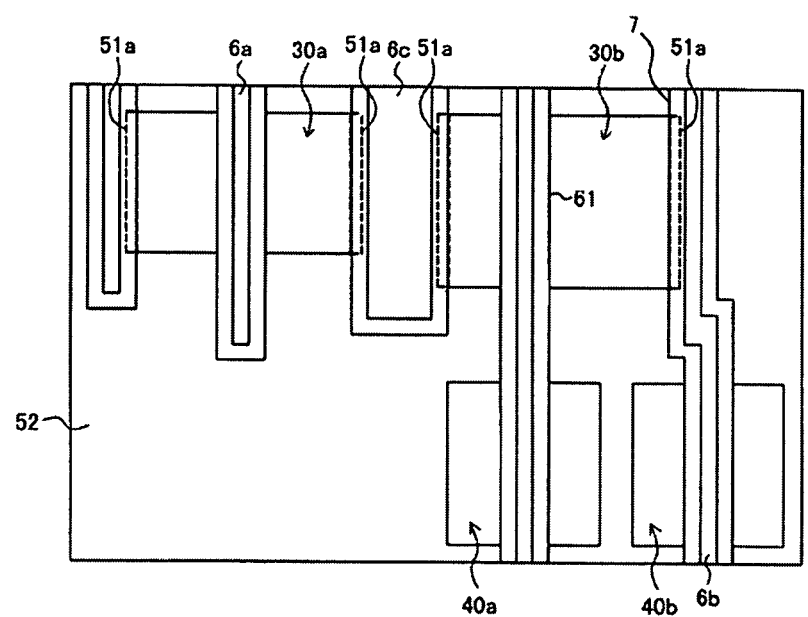
FIG. 7 is a plan view of a semiconductor substrate illustrating another gate electrode structure according to a modification.

As illustrated in FIG. 7, there are disposed two adjacent pMOSFET's 30a and 30b and two adjacent nMOSFET's 40a and 40b. A gate electrode 6b of the nMOSFET 40b extends to constitute another gate electrode for pMOSFET 30b. A side wall spacer 7 on the side wall of another gate electrode 6b covers the border area between pMOSFET 30b and isolation region. One dummy gate electrode 6c is formed between two adjacent pMOSFET's 30a and 30b, and side wall spacers 7 on both sides of the gate electrode constitute separation regions 51a. As in this example, it is possible to form the separation region by utilizing the side wall spacer of the gate electrode of another MOSFET. It is also possible to form a plurality of separation regions at the same time by using one dummy gate electrode.

In the embodiment described above, the Si—Ge epitaxial layer is formed prior to forming the SDE regions. Since the extensions are formed after the epitaxial growth heating process, a shallow extension can be formed easily. However, it is necessary to remove the preliminarily formed first side wall spacers and form the second side wall spacers after forming the extensions, resulting in an increase in the number of processes. The Si—Ge epitaxial layer may be formed after the SDE regions are formed.

Figure 8A:
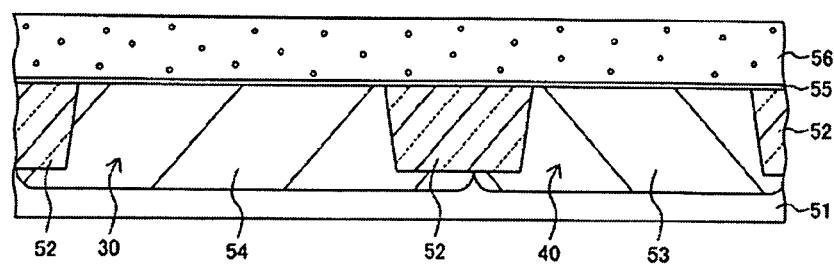
FIGS. 8A to 8N are cross sectional views of a semiconductor substrate illustrating main processes of a method of manufacturing a semiconductor device including MOS transistors illustrated in FIGS. 2A and 2B, by burying a semiconductor epitaxial layer after SDE regions and SD regions are formed.
Figure 8B:
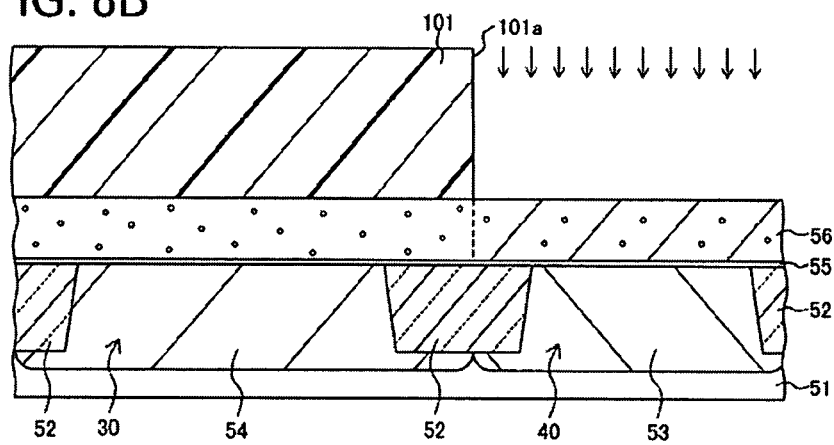
Figure 8C:
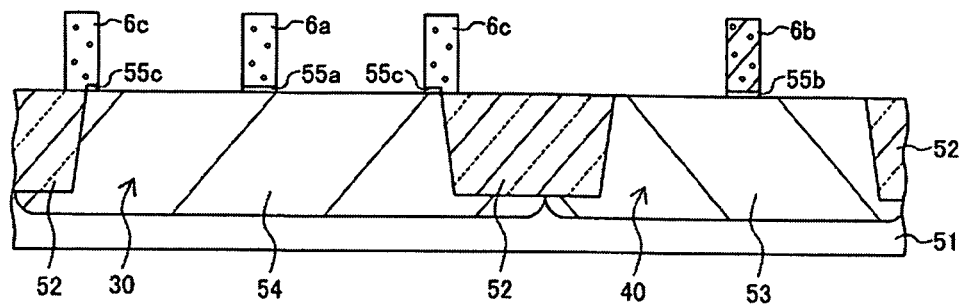
Figure 8D:
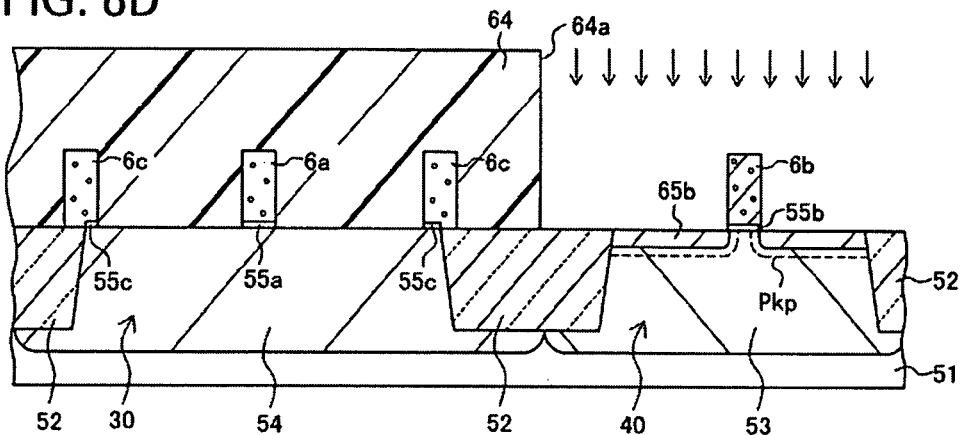
Figure 8E:
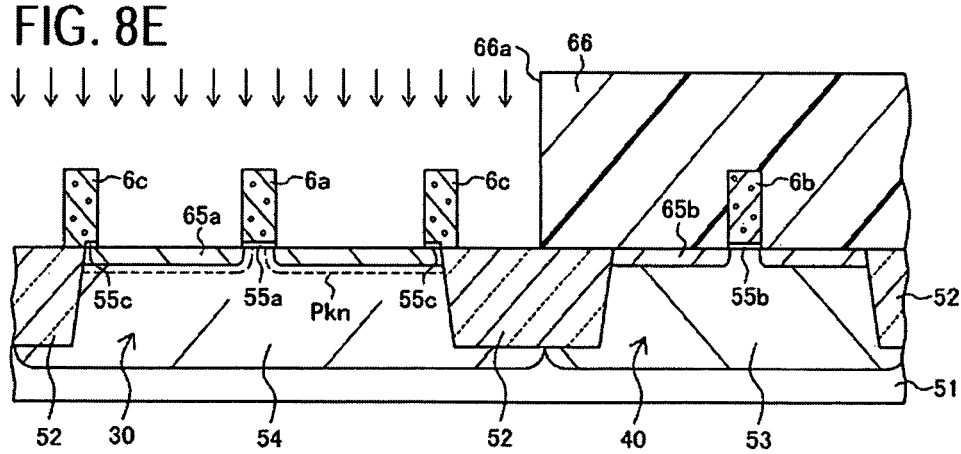
Figure 8F:
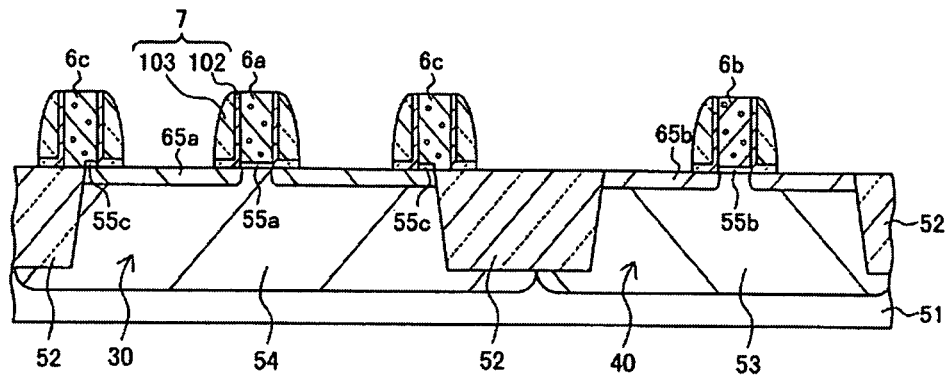
Figure 8G:
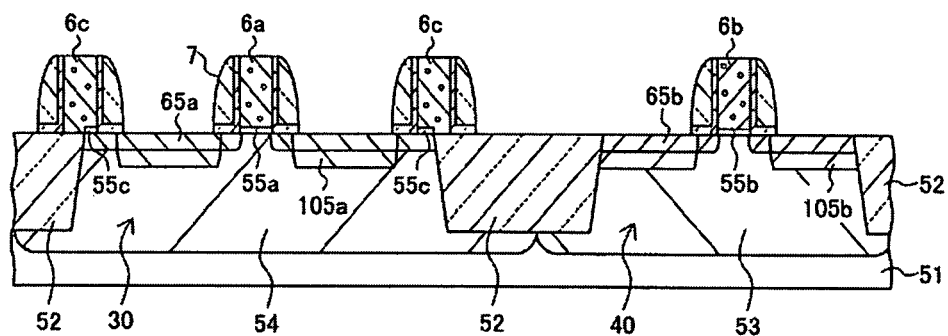
Figure 8H:
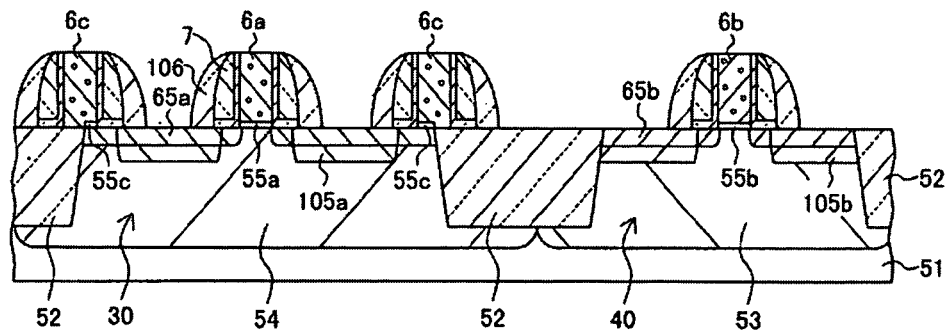
Figure 8I:
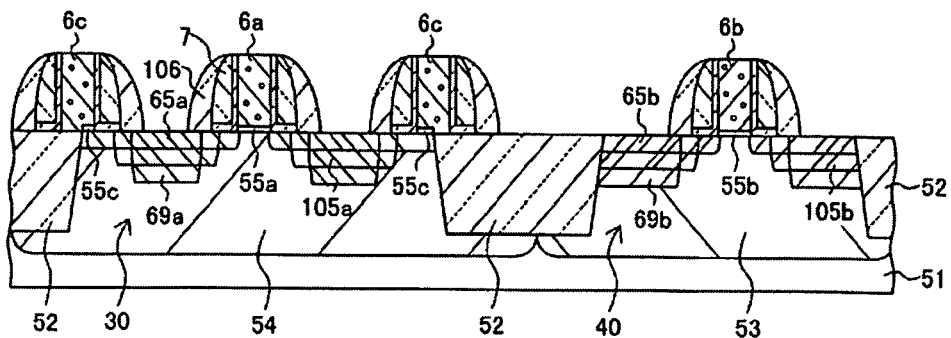
Figure 8J:
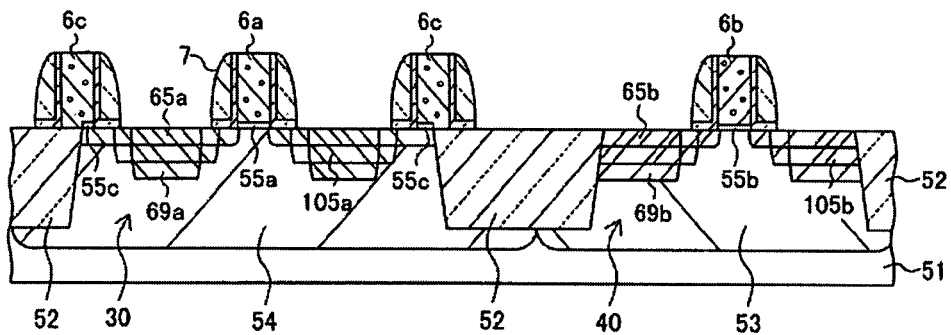
Figure 8K:
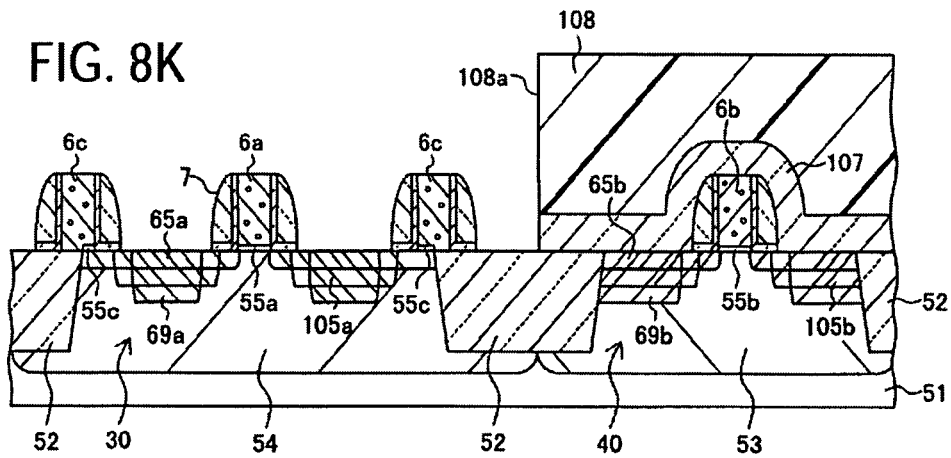
Figure 8L:
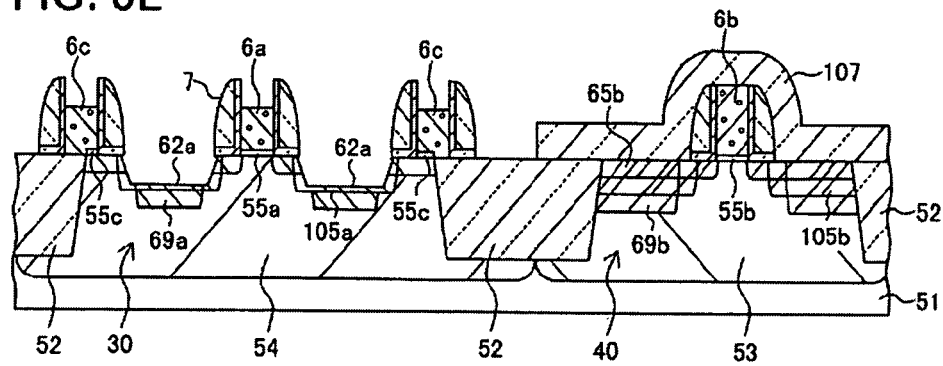
Figure 8M:
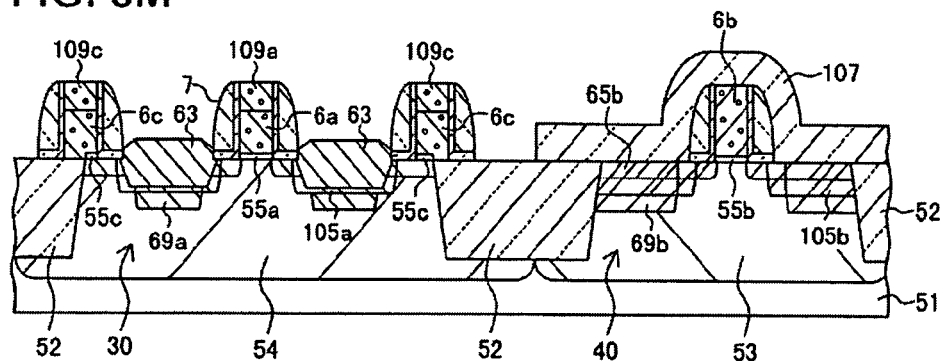
Figure 8N:
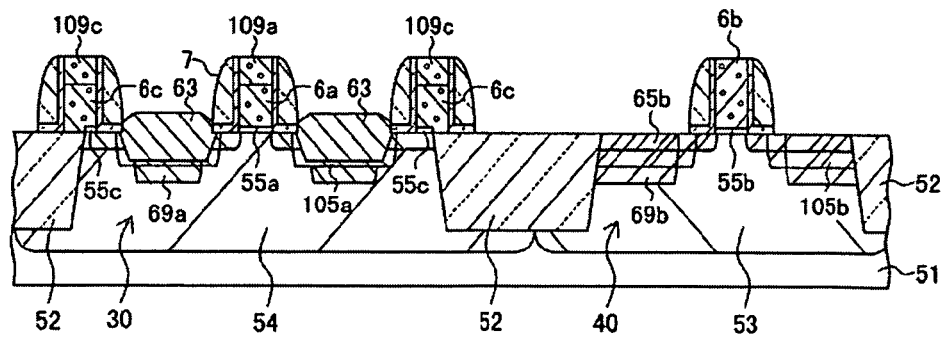

FIGS. 8A to 8N are cross sectional views of a semiconductor substrate illustrating main processes of a manufacture method by which a semiconductor epitaxial layer is embedded or buried after the source/drain extension (SDE) regions and source/drain (SD) regions are formed.

As illustrated in FIG. 8A, an isolation region 52 is formed in a Si substrate 51 to define a pMOSFET forming region 30 and a nMOSFET forming region 40. The isolation region 52 is formed by STI. By partitioning the active regions with a photoresist pattern, p-type impurity ions such as boron are implanted into the nMOS forming region 40 to form a p-type well 53. Similarly, n-type impurities such as phosphorus are introduced into the pMOS forming region 30 to form a n-type well 54 in the pMOS forming region 30. A gate insulating film 55 having a thickness of 1.2 nm is formed on the whole surface of the active regions, for example, by thermal oxidation. In place of the silicon oxide film, the gate insulating film may be a silicon oxide film subjected to plasma nitridation, i.e., a silicon oxynitride film, or an oxide film containing hafnium (Hf) having a high dielectric constant A polysilicon film 56 having a thickness of 100 nm is deposited on the whole substrate surface, covering the gate insulating film 55.

As illustrated in FIG. 8B, a photoresist film is formed on the whole substrate surface, for example, by spin coating, and a photoresist pattern 101 having an opening 110a on an area corresponding to the nMOS forming region 40 is formed by photolithography. By using the photoresist pattern 101 as a mask, n-type impurities such as phosphorous (P) are introduced into the polysilicon film 56, for example, by ion implantation at an acceleration energy of 10 keV and a dose of $8\times10^{15}$ cm$^2$. Thereafter, the resist pattern 101 is removed. A resist pattern having an opening in an area corresponding to the pMOSFET is formed, and p-type impurities such as boron (B) are introduced into the polysilicon film 56, for example, by ion implantation at an acceleration energy of 5 keV and a dose of $5\times10^{15}$ cm$^2$. A photoresist pattern having gate electrode shapes is formed, and the polysilicon film 56 and gate insulating film 55 are patterned, for example, by anisotropical etching.

As illustrated in FIG. 8C, a structure is therefore obtained in which gate electrodes 6a and 6b are formed in the pMOS forming region 30 and nMOS forming region 40, respectively, with gate insulating films 55a and 55b being interposed, and dummy gate electrodes 6c are formed in the border areas between the pMOS forming region and isolation region, with gate insulating films 55c being interposed.

As illustrated in FIG. 8D, a photoresist film is formed on the whole substrate surface, for example, by spin coating, and a photoresist pattern 64 having an opening 64a exposing the nMOS forming region 40 is formed by photolithography. By using the photoresist pattern 64 as a mask, p-type impurities such as indium (In) are introduced into relatively deep regions of the p-type well 53 on both sides of the gate electrode 6b, for example, by ion implantation at an acceleration energy of 50 keV and a total dose of $5\times10^{13}$ cm$^2$, to form p-type pocket regions Pkp. By using the photoresist pattern 64 as a mask, n-type impurities such as arsenic (As) are introduced into shallow regions of the p-type well 53 on both sides of the gate electrode 6b, for example, by ion implantation at an acceleration energy of 5 keV and a dose of $1\times10^{15}$ cm$^2$, to form source/drain extension (SDE) regions 65b. The photoresist pattern 64 is thereafter removed. Since the pocket region Pkp has the same conductivity type as that of the well 53, the pocket region is not drawn in the succeeding drawings.

As shown in FIG. 8E, a photoresist film is formed on the whole substrate surface, for example, by spin coating, and a photoresist pattern 66 having an opening 66a exposing the pMOS forming region 30 is formed by photolithography. By using the photoresist pattern 66 as a mask, n-type impurities such as As are introduced into relatively deep regions of the n-type well 54 between the gate electrode 6a and dummy gate electrodes 6c, for example, by ion implantation at an acceleration energy of 40 keV and a dose of $2\times10^{13}$ cm$^2$, to form n-type pocket regions Pkn. By using the photoresist pattern 66 as a mask, p-type impurities such as boron (B) are introduced into shallow regions of the n-type well 54 between the gate electrode 6a and dummy gate electrodes 6c, for example, by ion implantation at an acceleration energy of 0.5 keV and a dose of $2\times10^{14}$ cm$^2$, to form SDE regions 65a. The photoresist pattern 66 is thereafter removed.

As illustrated in FIG. 8F, a silicon oxide film 102 having a thickness of, e.g., 10 nm is formed and then a silicon nitride film 103 having a thickness of, e.g., 80 nm is formed, for example, by CVD. Thereafter, the silicon nitride film 103 and silicon oxide film 102 are anisotropically etched, for example by RIE, to form side wall spacers 7 constituted of a lamination structure of the silicon oxide film 102 and silicon nitride film 103 on side walls of the gate electrodes 6a, 6b and 6c. The gate electrode and its side wall spacers are collectively called a gate electrode structure, and the dummy gate electrode and its side wall spacers are collectively called a dummy gate electrode structure, in some cases.

As illustrated in FIG. 8G, by partitioning the active regions with a photoresist pattern, n-type impurity ions such as As are implanted into the nMOS forming region at an acceleration energy of 10 keV and a dose of $2\times10^{15}$ cm$^2$, to form regions 105b further lowering the resistances of the SDE regions, and p-type impurity ions such as boron (B) are implanted into the pMOS forming region at an acceleration energy of 2 keV and a dose of $1\times10^{15}$ cm$^2$, to form regions 105a further lowering the resistances of the SDE regions. This process is an auxiliary process of reducing parasitic resistance of MOSFET, and may be omitted.

As illustrated in FIG. 8H, a silicon oxide film having a thickness of 40 nm is formed on the whole substrate surface, for example, by CVD, and thereafter is anisotropically etched, for example by RIE, to form side wall spacers 106 made of silicon oxide on the side wall of the side wall spacers 7.

As illustrated in FIG. 8I, by partitioning the active regions with a photoresist pattern, n-type impurity ions such as P are implanted into the nMOS forming region at an acceleration energy of 8 keV and a dose of $8 \times 10^{15}$ cm$^2$, to form source/drain (SD) regions 69b, and p-type impurity ions such as B are implanted into the pMOS forming region at an acceleration energy of 5 keV and a dose of $5 \times 10^{15}$ cm$^2$, to form source/drain (SD) regions 69a.

After the SD regions 69a and 69b are formed, heat treatment is performed, for example, by RTA, to activate introduced impurities. The heat treatment is performed in a short time at a temperature of, e.g., 900° C.

As illustrated in FIG. 8K, a silicon oxide film 107 having a thickness of, e.g., 40 nm, is formed on the whole substrate surface, for example, by CVD. A photoresist film is formed on the whole substrate surface, and a photoresist pattern 108 having an opening 108a exposing the pMOS forming region 30 is formed by photolithography. By using the photoresist pattern 108 as a mask, the silicon oxide film 107 in the pMOS forming region 30 is etched and removed.

As illustrated in FIG. 8L, the Si substrate 51 in the pMOS forming regions between the gate electrode structure GS and dummy gate electrode structures DGS are selectively etched, for example, by RIE, to form recesses having a depth of 50 nm. At this time, the upper surfaces of the gate electrodes 6a and 6c in the PMOS forming region are also etched. A wet process using hydrofluoric acid (HF) is performed to clean the surface of the recess. Ne chemical dry etching is performed for the recess to form a recess 62a creeping under the side wall spacer. After etching, the photoresist pattern 108 is removed.

As illustrated in FIG. 8M, Si—Ge layers 63 are selectively and epitaxially grown on the upper surfaces of the recesses 62a and gate electrodes 6a and 6c, for example, by low pressure thermal CVD.

As illustrated in FIG. 8N, the silicon oxide film 107 in the nMOS forming region 40 is removed, for example, by fluoric acid.

As described above, the Si—Ge layers 63 are formed, while being separated from the isolation region 52 by the dummy gate electrode structures DGS. Thereafter, by using a well-known SALICIDE method and multilayer wiring technologies, a ULSI semiconductor device is manufactured.

In the above description, the Si—Ge layer is grown as a semiconductor epitaxial layer for generating a stress in the pMOSFET channel region. Instead of the Si—Ge layer, a Si—Ge—C layer may be grown. It is also possible to form a semiconductor epitaxial layer for generating a stress in the nMOSFET channel region. The semiconductor epitaxial layer for this purpose may be a Si—C layer. Also in the case in which the semiconductor epitaxial layer is formed in a nMOSFET, the semiconductor epitaxial layer is formed, while being separated from at least a portion of the isolation region.

It has been found that when an embedded epitaxial layer having a lattice constant different from that of a semiconductor substrate is formed in a state being separated or spaced from an isolation region, leak current can be suppressed. Similar effects can be expected if the embedded epitaxial layer has a portion being separated from the isolation region.

A gate electrode and another gate electrode are patterned at the same time, side wall spacers are formed, and the substrate is etched to form recesses in such a state that another gate electrode structure constituted of another gate electrode and its side wall spacers on the side walls of another gate electrode covers a portion of the border between the active region and isolation region. In this manner, the recess can be separated from a portion of the isolation region without any additional process. The epitaxial layer grown in the recess is separated from the isolation region. By pattering the gate electrode and another gate electrode at the same time, deviations to be caused by position misalignment in the patterning process can be suppressed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relates to a showing of the superiority and inferiority of the invention. Although the embodiments of the present invention have been described in detail, it should be understood that the various changes, substitutions, and alterations could be made hereto without departing from the spirit and scope of the invention.

What are claimed are:

1. A semiconductor device comprising:
   a semiconductor substrate made of first semiconductor having a first lattice constant;
   an isolation region formed in said semiconductor substrate and defining an active region;
   a gate electrode structure including an elongating gate electrode formed above and crossing said active region;
   the active region being defined between first and second borders between the active region and the isolation region, which borders are along elongating direction of the gate electrode structure;
   the gate electrode structure, defining a first source/drain region adjacent to said first border, and a second source/drain region adjacent to said second border, in said active region;
   a first subsidiary gate electrode structure including a first subsidiary gate electrode, disposed above a surface of said semiconductor substrate and covering the first border adjacent to the first source/drain region;
   a recess formed by etching the first source/drain region between said gate electrode structure and said first subsidiary gate electrode structure; and
   a semiconductor layer epitaxially grown embedding said recess and made of second semiconductor having a second lattice constant different from said first lattice constant.

2. The semiconductor device according to claim 1, further comprising a second subsidiary gate electrode structure covering said second border adjacent to said second source/drain region.

3. The semiconductor device according to claim 1, wherein the first subsidiary gate electrode of said first subsidiary gate electrode structure covers said first border, and said first subsidiary gate electrode structure is a dummy structure having no circuit function.

4. The semiconductor device according to claim 1, wherein said first subsidiary gate electrode structure includes another side wall spacer on side wall of said first subsidiary gate electrode, and said another side wall spacer covers said first border, and said first subsidiary gate electrode is disposed on said isolation region.

5. The semiconductor device according to claim 1, wherein said active region has a rectangular shape defined by first, second third and fourth sides, the first and third sides constituting a first pair of opposing sides, and the second and fourth sides constituting a second pair of opposing sides and overlapping said first and second borders, said gate electrode structure is disposed crossing said first and third sides, and said first subsidiary gate electrode structure is disposed covering whole of said second side.

6. The semiconductor device according to claim 5, further comprising a second subsidiary gate electrode structure covering said fourth side.

7. The semiconductor device according to claim 6, wherein at least one of said first and second subsidiary gate structures has a portion covering a portion of said first pair of opposing sides.

8. The semiconductor device according to claim 7, wherein said first and second subsidiary gate
electrode structures have portions covering portions of said first pair of opposing sides.

9. The semiconductor device according to claim 1, wherein said first semiconductor is silicon, and said second semiconductor is Si—Ge, Si—Ge—C or Si—C.

10. The semiconductor device according to claim 1, wherein said active region is n-type silicon, and said second semiconductor is Si—Ge, or Si—Ge—C.

11. The semiconductor device according to claim 1, wherein a separation distance between said semiconductor layer and said isolation region is in a range 5 from 5 nm to 100 nm.

12. A semiconductor device comprising:
a semiconductor substrate made of first semiconductor having a first lattice constant;
an isolation region formed in said semiconductor substrate and defining an active region of rectangular shape having first and second end portions adjacent to first and second borders each between said active region and said isolation region;
a gate electrode structure formed above said active region, separated from said first and second end portions, and crossing opposing sides of the rectangular shape, and defining a first source/drain region and a second source/drain region, adjacent to the first and second borders, respectively;
a first subsidiary gate electrode structure disposed above a surface of said semiconductor substrate and covering said first end portion of the active region, spaced from said gate electrode structure;
said first end portion of the active region below said first subsidiary gate electrode structure having a rectangular shape defined by first, second, third and fourth sides, said first side being disposed in the active region, and said second, third and fourth sides being disposed at border between said active region and said isolation region;
a recess formed by etching said active region between said gate electrode structure and said first subsidiary gate electrode structure; and
a semiconductor layer epitaxially grown embedding said recess and made of second semiconductor having a second lattice constant different from said first lattice constant.

13. The semiconductor device according to claim 12, further comprising:
a second subsidiary gate electrode structure disposed above a surface of said semiconductor substrate and covering the second end portion;
said second end portion of the active region below said second subsidiary gate electrode structure having a rectangular shape defined by fifth, sixth, seventh and eighth sides, said fifth side being disposed in the active region, and said sixth, seventh and eighth sides being disposed at border between said active region and said isolation region.

14. The semiconductor device according to claim 13, wherein said first and second subsidiary gate electrode structures are dummy gate electrode structures having no circuit function.

* * * * *